(12) United States Patent
Fisher et al.

(10) Patent No.: US 8,993,191 B2
(45) Date of Patent: Mar. 31, 2015

(54) MEASUREMENT DEVICE FOR MEASURING VOLTAGES ALONG A LINEAR ARRAY OF VOLTAGE SOURCES

(75) Inventors: John Matthew Fisher, San Jose, CA (US); Ian Russell, Sunnyvale, CA (US); Chad Pearson, Mountain View, CA (US); Robert Hintz, San Jose, CA (US); Nathan Ben Erlin, San Jose, CA (US); David Edmonston, Santa Cruz, CA (US); Stephen Couse, Sunnyvale, CA (US); Michael Dubuk, San Mateo, CA (US)

(73) Assignee: Bloom Energy Corporation, Sunnyvale, CA (US)

( * ) Notice: Subject to any disclaimer, the term of this patent is extended or adjusted under 35 U.S.C. 154(b) by 390 days.

(21) Appl. No.: 13/556,794

(22) Filed: Jul. 24, 2012

(65) Prior Publication Data

US 2013/0029245 A1    Jan. 31, 2013

Related U.S. Application Data

(60) Provisional application No. 61/511,305, filed on Jul. 25, 2011.

(51) Int. Cl.
| | |
|---|---|
| *G01R 31/36* | (2006.01) |
| *H01M 8/04* | (2006.01) |
| *H01M 8/24* | (2006.01) |
| *G01R 1/067* | (2006.01) |
| *G01R 1/07* | (2006.01) |
| *H01M 10/48* | (2006.01) |

(52) U.S. Cl.
CPC ...... *H01M 8/04552* (2013.01); *H01M 8/04544* (2013.01); *H01M 8/04559* (2013.01); *H01M 8/04537* (2013.01); *G01R 31/3631* (2013.01); *G01R 31/3627* (2013.01); *G01R 31/3606* (2013.01); *G01R 31/36* (2013.01); *G01R 31/362* (2013.01); *G01R 31/3658* (2013.01); *G01R 1/06705* (2013.01); *G01R 1/07* (2013.01); *H01M 10/482* (2013.01); *Y02E 60/50* (2013.01)
USPC ........................................................ 429/467

(58) Field of Classification Search
None
See application file for complete search history.

(56) References Cited

U.S. PATENT DOCUMENTS

| | | | | |
|---|---|---|---|---|
| 5,583,444 | A * | 12/1996 | Nakamura et al. | 324/754.23 |
| 2007/0154755 | A1* | 7/2007 | Wardrop | 429/23 |
| 2007/0178366 | A1* | 8/2007 | Mahoney et al. | 429/44 |
| 2012/0225366 | A1* | 9/2012 | Suto et al. | 429/431 |

FOREIGN PATENT DOCUMENTS

WO    WO9305520    *    3/1993

* cited by examiner

*Primary Examiner* — Ula C. Ruddock
*Assistant Examiner* — Matthew Van Oudenaren
(74) *Attorney, Agent, or Firm* — The Marbury Law Group PLLC

(57) ABSTRACT

A measurement device for measuring voltages along a linear array of voltage sources, such as a fuel cell stack, includes at least one movable contact or non-contact voltage probe that measures a voltage of an array element.

9 Claims, 14 Drawing Sheets

MEASUREMENT DEVICE FOR MEASURING VOLTAGES ALONG A LINEAR ARRAY OF VOLTAGE SOURCES

This application claims priority under 35 U.S.C. §119(e) from provisional application No. 61/511,305 filed Jul. 25, 2011. The No. 61/511,305 provisional application is incorporated by reference herein, in its entirety, for all purposes.

BACKGROUND

Electrical power systems are often built from arrays of smaller components such as battery cells, photocells, photovoltaic panels, and fuel cells. For example, fuel cells are often combined into units called "stacks" in which the fuel cells are electrically connected in series and separated by electrically conductive interconnects, such as gas separator plates which function as interconnects.

Fuel cells are typically combined to form a stack in a linear array (configured horizontally or vertically) in which the component fuel cells are electrically connected in series to obtain a preset voltage. A fuel cell stack may contain conductive end plates on its ends. A generalization of a fuel cell stack is the so-called fuel cell segment or column, which may contain one or more fuel cell stacks connected in series (e.g., where the end plate of one stack is connected electrically to an end plate of the next stack). A fuel cell segment or column may contain electrical leads which output the direct current from the segment or column to a power conditioning system. A fuel cell system can include one or more fuel cell columns, each of which may contain one or more fuel cell stacks, such as solid oxide fuel cell stacks.

In the operation of a voltage array, it is often desirable to know the voltage of each component of the array. For example, it may be desirable to know the output voltage of each fuel cell within a fuel cell stack to determine the health of a stack, to provide data for optimization tools, and to determine when maintenance is required. It is also important to minimize impact that the measurement device has on the parameters that it is measuring.

SUMMARY

Embodiments herein are directed to the measurement of voltages along a linear array of voltage sources. According to embodiments herein, voltage measurements may be made by contact or non-contact probe sensors determine a voltage of a device under test.

According to one embodiment, a fuel cell system includes at least one fuel cell stack and a measuring device. The measuring device includes at least one movable contact or non-contact voltage probe that is configured to be propelled along the fuel cell stack to measure a voltage of fuel cell stack elements.

According to another embodiment, a method of testing a fuel cell stack includes moving at least one contact or non-contact voltage probe along the fuel cell stack and sequentially measuring a voltage of fuel cell stack elements.

According to yet another embodiment, a measurement device for measuring a voltage of a linear array of voltage sources includes a carriage, a screw mechanism, guide rails, electrical conductors and a signal processor. The one or more probes are attached to the carriage. Each of the one or more probes includes a sensing element configured to receive a signal from the linear array indicative of a voltage. The guide rails guide the carriage parallel to the linear array. The screw mechanism imparts linear motion to the carriage. An electrical conductor is connected to each of the one or more probes for receiving the signal from the sensing element. The signal processor is configured to receive the signal from the electrical conductor and to determine a voltage from the signal.

DETAILED DESCRIPTION

Embodiments described herein allow for the contact or non-contact voltage measurement of a semi-continuously-varying (small discrete geometric/electric steps) voltage array of voltage sources. Embodiments may be configured for use in a very high temperature environment, but this is not meant as a limitation.

Embodiments may be illustrated by reference to a voltage source array comprising fuel cell components. However, such embodiments may be used to take measurements of voltage source arrays comprising other voltage sources, such as, but not limited to, batteries, capacitors, photo-cells (e.g., photodetector array), and photovoltaic devices (e.g., solar cell panels or solar cells) among others.

Figure 1A:
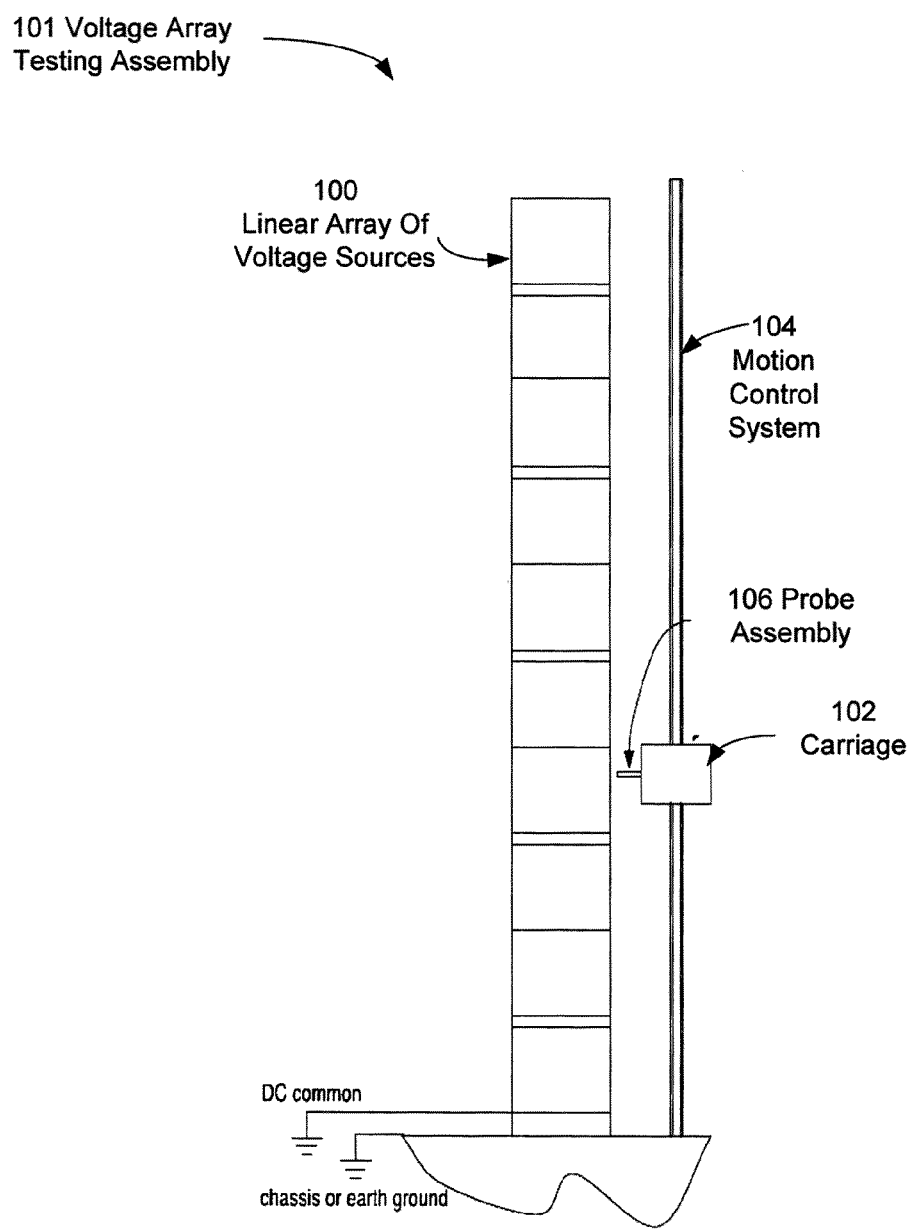
FIG. 1A is a block diagram illustrating a voltage array testing assembly according to an embodiment.

FIG. 1A is a block diagram illustrating a voltage array testing assembly 101 according to an embodiment. As illustrated in FIG. 1A, a carriage 102 is moved by a motion control system 104. The movement of the carriage 102 moves probe assembly 106 along a linear array of voltage sources 100. As illustrated in FIG. 1A, the voltage array 100 is oriented vertically and the probe assembly 106 moves vertically under the control of motion control system 104. However, this is not intended to be limiting. In other embodiments, the voltage array 100 may be oriented horizontally or in any direction between vertical and horizontal. The probe assembly 106 would be oriented to move horizontally or in any direction between vertical and horizontal under the control of motion control system 104.

Figure 1B:
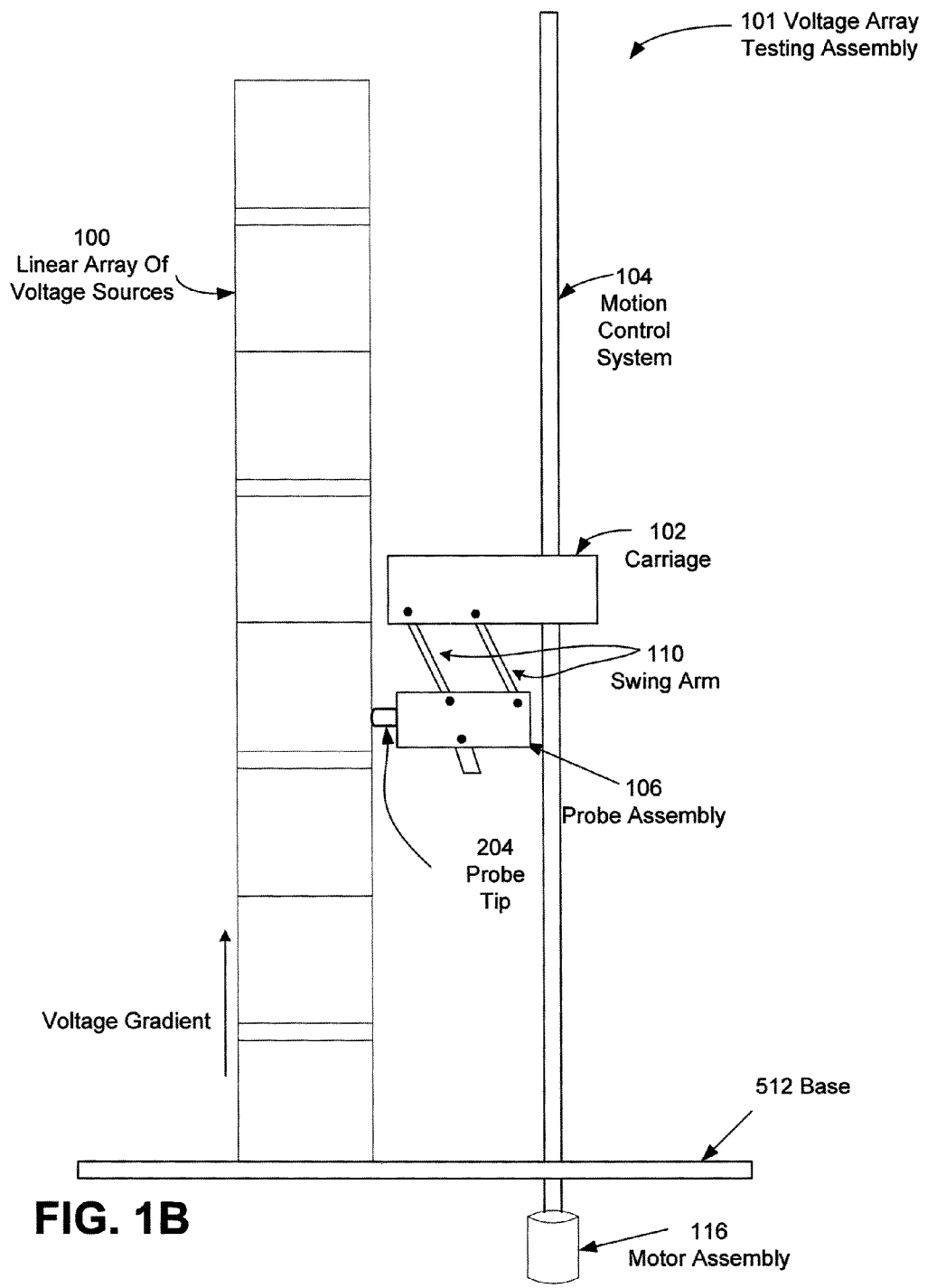
FIG. 1B is a block diagram illustrating a voltage array testing assembly utilizing a contact probe according to an embodiment.

FIG. 1B is a block diagram illustrating a voltage array testing assembly 101 utilizing a contact probe according to an embodiment. An array of voltage sources 100 is contacted by a probe assembly 106 that is moved along the voltage array 100 by a motion control system 104. The probe assembly 106 is suspended from a carriage 102 by swing arms 110. The swing arms 110 are configured such that the probe 204 makes contact with the linear array 100 due to gravitational forces imposed on the probe assembly 106.

The motion control system is driven by a motor assembly 116. The drive motor assembly 116 may be located below base 512, for example under table or other structure that supports the voltage source array 100, or in any other location that permits connection to motion control system 104. As illustrated, the voltage array 100 is oriented vertically and the probe assembly 106 moves vertically under the control of motion control system 104. In other embodiments, the voltage source array 100 may be oriented in any direction between vertical and horizontal and the probe assembly 106 would be oriented to move in any direction between vertical and horizontal under the control of motion control system 104.

Figure 1C:
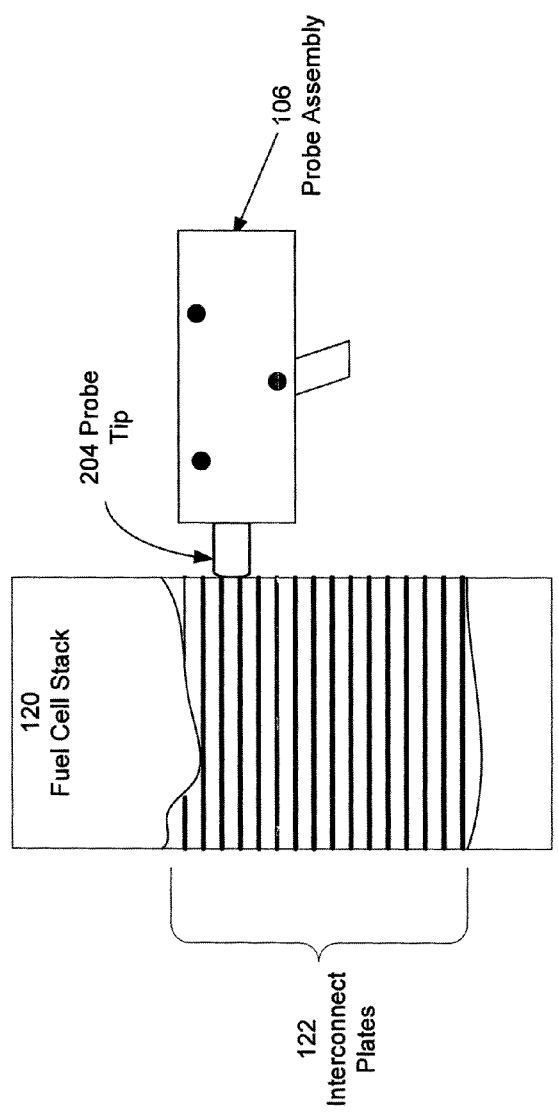
FIG. 1C is a block diagram illustrating a view of a fuel cell array under test utilizing a contact probe according to an embodiment.

FIG. 1C is a block diagram illustrating a view of a fuel cell array under test utilizing a contact probe according to an embodiment.

In an embodiment, the voltage source array 100 may be a fuel cell stack, such fuel cell stack 120 illustrated in FIG. 1C. Fuel cells are often combined into units called "stacks" in which the fuel cells are electrically connected in series and separated by electrically conductive interconnects, such as gas separator plates which function as interconnects. Thus, adjacent interconnects are separated by a fuel cell and sealant material that is used to seal the fuel cells to the interconnects.

Fuel cells are typically combined to form a stack in a linear array (configured horizontally or vertically) in which the component fuel cells are electrically connected in series to obtain a preset voltage. A fuel cell stack may contain conductive end plates on its ends. The fuel cell stack 120 uses interconnects 122 to connect fuel cells (not shown for clarity) in series. Voltage measurements may be made at each of the interconnects to determine the voltage of each cell within the stack 120.

In an embodiment, the probe tip 204 may be constructed from an electrically conductive ceramic material, such as a spinel ceramic material, that has a resistivity that is high enough to prevent shorting of adjacent interconnects 122 if two interconnects are contacted at the same time by one probe tip 204 while low enough to measure the voltage of each of the fuel cells that make up the fuel cell stack 120. For example, the probe tip 204 may have a resistivity of about 0.1 to 3 Ω-cm. In another embodiment, the probe is configured to accept shorting of the adjacent elements and to limit the shorting current from about 1 mA to about 100 mA. For example, a probe material with resistivity in the range of 0.1 Ω-cm and 3 Ω-cm at 850° C. would serve this purpose. Other ceramic materials would also provide this functionality, such as CMCs described below containing electrically conductive fibers in an insulating matrix.

In another embodiment, the contacting probe uses oxide composite materials (e.g., ceramic composite materials) in combination with a voltage sensing wire to perform cell voltage testing at elevated temperatures. The CMC may include, for example, a matrix of aluminum oxide (e.g., alumina), zirconium oxide or silicon carbide. Other matrix materials may be selected as well. The CMC may include ceramic or other electrically insulating fibers in the matrix. The fibers may be made from alumina, carbon, silicon carbide, or any other suitable material. Any combination of the matrix and fibers may be used. Additionally, the fibers may be coated with an interfacial layer designed to improve the fatigue properties of the CMC. In an embodiment, the CMC forms a sheath or shell around the voltage sensing wire, which may be made of any suitable electrically conductive material, such as platinum, copper, etc. In an embodiment, the wire is be exposed at the tip of the probe and used to test linear arrays where shorting of adjacent elements of the linear array is not a concern.

Figure 2:
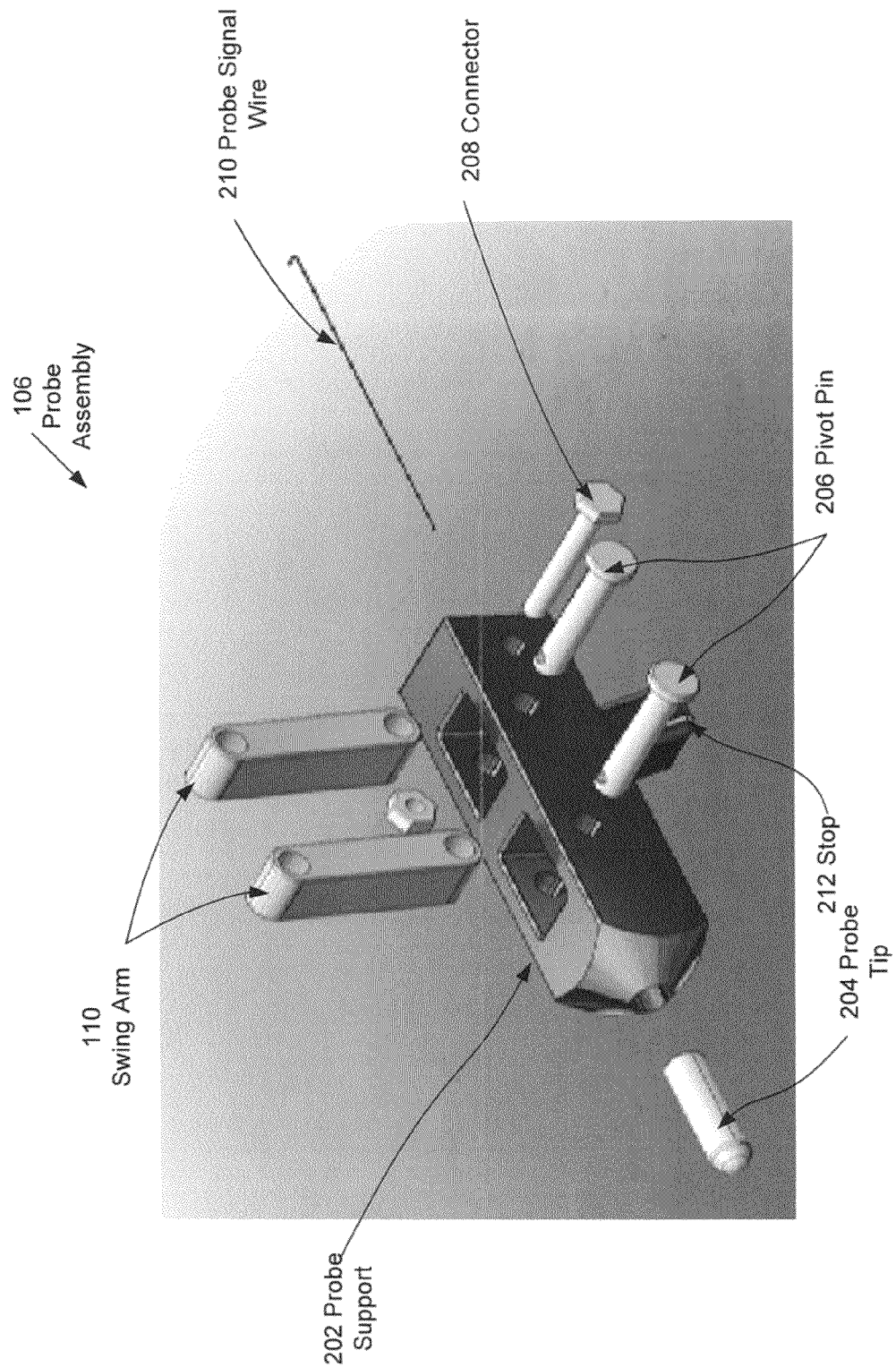
FIG. 2 is a perspective view illustrating components of a sensing probe assembly of FIG. 1B according to an embodiment.

FIG. 2. is a block diagram illustrating components of a sensing probe assembly according to an embodiment.

In an embodiment illustrated in FIG. 2, the probe assembly 106 comprises a probe support 202, a probe tip 204, pivot pins 206, swing arms 110, a signal conductor 210, a signal connector 208 and a stop 212. The probe support 202 provides a housing into which a probe tip 204, pivot pins 206, swing arms 110, a signal conductor 210, a signal connector 208 and optionally a stop 212 are inserted into holes in the housing. Alternatively, stop 212 may be integrated with probe support 202. Swing arms 110 move freely on pivot pins 206 or other connection devices. The swing arms 110 also connect to the carriage 102 (see, FIGS. 1B and 5C) using the pivot pins 206 or other connection devices that allow the probe support 202 to swing freely below the carriage 102. Preferably, the respective pivot pins on the carriage 202 (which support the upper ends of the swing arms 110) are positioned closer to the array of voltage sources 100 than the respective pivot pins 206 on the probe support, such that the lower ends of swing arms 110 (connected to the pivot pins 206 on probe support 202) slope away from the array of voltage sources 100 when the probe tip 204 contacts the array 100. The diagonal positioning of the swing arms 110, with the upper arm ends being closer to the array 100 than the respective lower arm 110 ends, allows gravity to pull the probe tip 204 toward the array of voltage sources 100, as shown in FIG. 1B. The probe tip 204 thus swings to/from the voltage source array 100 so as to contract each source in the voltage array 100 as the carriage 102 moves along the array. The probe tip 204 makes contact with the linear array 100 due to gravitational forces imposed on the probe assembly 106.

Figure 3:
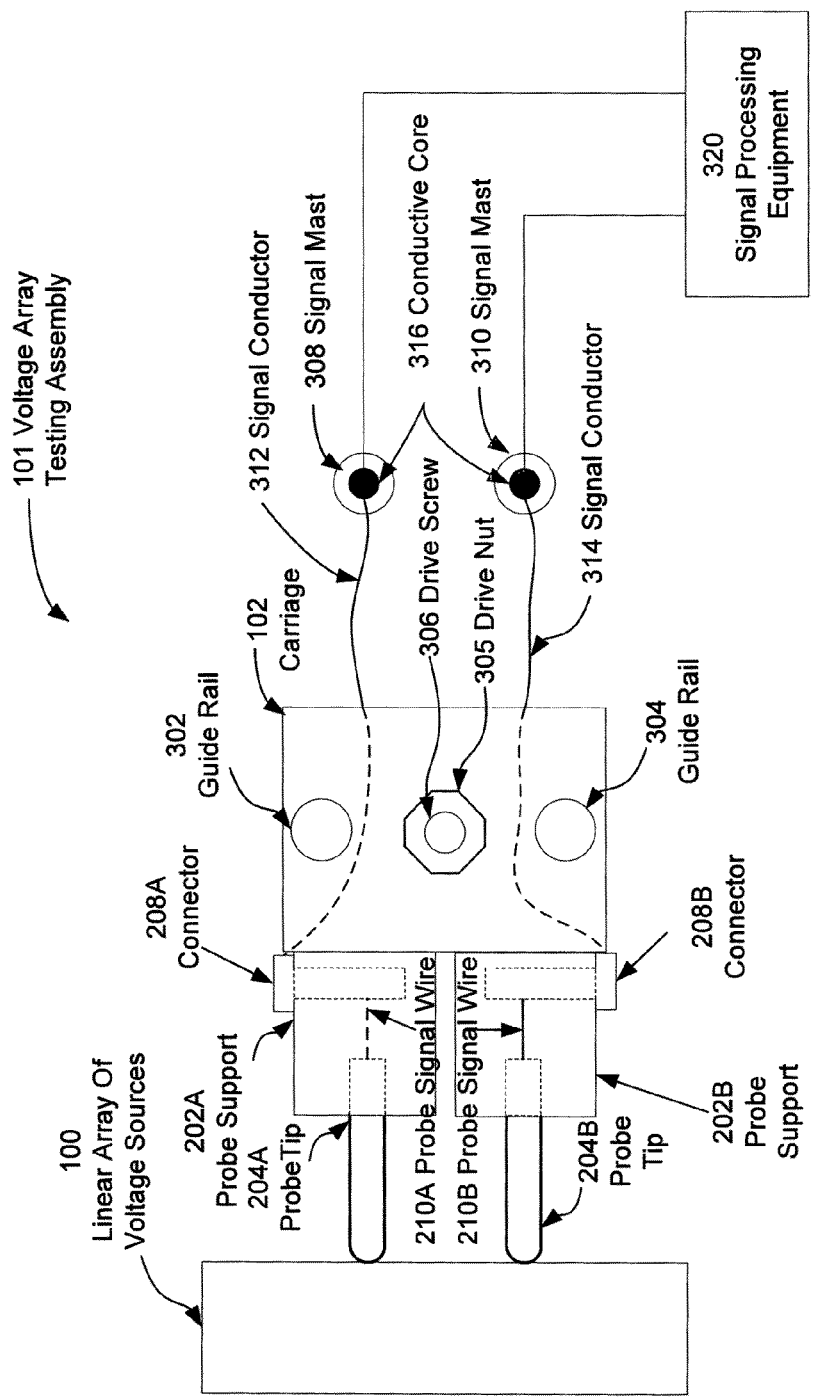
FIG. 3 is a block diagram illustrating a top view of a contact sensing probe assembly of FIG. 1B according to an embodiment.

The probe signal wire 210 connects the probe tip 204 to the connector 208. The connector 208 joins a signal conductor (312 and 314 in FIGS. 3 and 5B) to a signal mast (FIG. 3 and FIG. 5B, 308). The probe signal wire may be a platinum wire or other conductor, for example, a platinum wire having a diameter of 0.5 mm. In an embodiment, the signal conductor 312 may be a conductive flexible chain.

A stop 212 limits the movement of the carriage/probe assembly at the lower limit of the motion control system 104. The stop 212 may a rod or a bar that is attached to or integrated with the bottom of the probe support 202 and acts as a door stop when probe support 202 is lowered to the base support.

In an embodiment, the probe support 202 is formed from a ceramic matrix composite (CMC). The CMC may include, for example, a matrix of aluminum oxide (e.g., alumina), zirconium oxide or silicon carbide. Other matrix materials may be selected as well. The CMC may include ceramic or other electrically insulating fibers in the matrix. The fibers may be made from alumina, carbon, silicon carbide, or any other suitable material. Any combination of the matrix and fibers may be used. Additionally, the fibers may be coated with an interfacial layer designed to improve the fatigue properties of the CMC.

FIG. 3 is a block diagram illustrating a top view of a contact sensing probe assembly of FIG. 1B according to an embodiment.

The carriage 102 is propelled (vertically or horizontally) by the motion control system 104. In an embodiment, the motion control system includes a threaded drive screw 306 that rotates within a drive nut 305 affixed to the carriage 102. The carriage 102 is guided by guide rails 302 and 304, which extend through openings in the carriage 102.

In an embodiment, the drive nut 305 may be a metallic nut assembly, or a ceramic one, which may be metalized on its interior surface. The drive nut 305 may include a low-friction coating applied to reduce the required drive torque to move the carriage assembly up and down the drive screw 306. The drive screw 306 may be of the acme type, or a similar thread profile intended for linear drive purposes. The drive screw 306 may be metallic, which is less expensive, or ceramic, which has advantages such as material creep properties, oxidation properties, tribology and thermal expansion.

The drive screw 306 may be coupled to a permanent magnet motor assembly, a gear-motor, or similar system 116 (shown in FIG. 1B).

In an embodiment, the probe assembly 106 is configured with two probe tips 204A and 204B, supported in respective probe supports 202A and 202B, which may be configured with horizontal offset to provide differential voltage readings simultaneously between two or more portions of one voltage array element (for example, a single interconnect of a fuel cell). For example, in the case where the linear array is a fuel cell stack, the two probes tips 204A and 204B may be configured to contact two portions of an edge of one interconnect.

In an embodiment, the probe assembly 106 is configured with two probe tips 204A and 204B, supported in respective probe supports 202A and 202B, which may be configured with horizontal offset to provide differential voltage readings simultaneously between two or more portions of one voltage array element (for example, a single interconnect of a fuel cell). For example, in the case where the linear array is a fuel cell stack, the two probes tips 204A and 204B may be configured to contact two portions of an edge of one interconnect simultaneously to allow for direct measurement of the difference in voltage between the left and right portions of an interconnect in the fuel cell stack under test.

In another embodiment, the two probe tips 204A and 204B may be configured side-by-side with a specific vertical offset between them to allow a differential voltage measurement between two adjacent elements in the voltage array (for example, two adjacent interconnects). As previously noted, "adjacent" includes interconnects that are separated by a fuel cell and the seals between the fuel cell and the interconnect plate. Measurements may also be taken with one probe or more than two probes, such as three or more probes.

Figure 8:
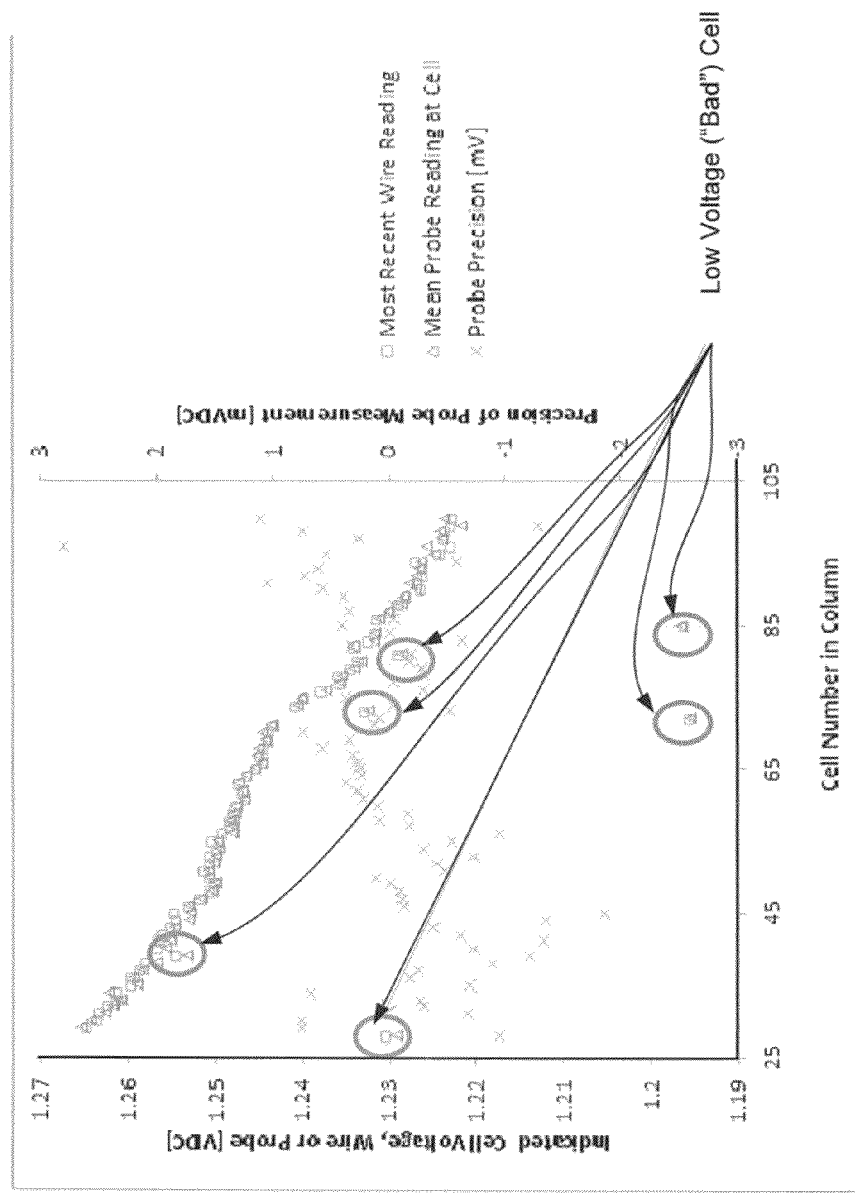
FIG. 8 is a graph illustrating measurements of fuel cell stack voltages acquired by a voltage array testing assembly according to FIGS. 1B and 5D in comparison to measurements acquired by direct wire connection testing of the fuel cell voltages.

In an embodiment, the differential voltage (i.e., difference in measured voltages) between adjacent elements of a voltage source array (for example, two adjacent interconnects) may also be acquired by a single probe tip 204. In this embodiment, the carriage 202 is moved to a position to permit the probe tip 204 to measure a first voltage of a first interconnect. In other words, one or more probe tips 204 contact the edge of the first interconnect. The carriage is then moved up or down to position the probe tip 204 to measure a second voltage of second interconnect that is adjacent to the first interconnect. In other words, one or more probe tips 204 contact the edge of the second interconnect in the stack. The difference between the first and second measured voltages is then determined to arrive at the differential voltage between the first and the second interconnects. The differential voltage may be compared to either (i) a reference value in a look up table and/or (ii) to measured differences in voltages between other interconnects in the stack. In the second comparison, if the differential voltage between the first and second interconnects falls on or near (e.g., within a predetermined deviation from) a line plotted for measured differences in voltages for other interconnects, then this indicates that the fuel cell located between the first and the second interconnects is acceptable and not defective. In contrast, if the differential voltage between the first and second interconnects outside the predetermined deviation from a line plotted for measured differences in voltages for other interconnects, then this indicates that the fuel cell located between the first and the second interconnects is defective or unacceptable. For example, as shown in FIG. 8, six defective or unacceptable (e.g., "bad") cells indicated by circles deviate from the roughly diagonal line formed in a plot of voltage difference versus cell number for all cells in the stack. Of course if a computer is used for the second comparison, then the actual line shown in FIG. 8 does not need to be generated or plotted because the computer can simply determine if each measured voltage difference value exceeds a predetermined deviation from one or more preceding or subsequent measured voltage difference values. Measurements may also be taken with more than probe, such as two or more probes that are configured side-by-side with no vertical offset.

Signals from the probe tip 204A are provided to connector 208A by a probe signal wire 210A. Signals from the probe tip 204B are provided to connector 208B by a probe signal wire 210B. A signal conductor 312 connects signal mast 308 to connector 208A, and a signal conductor 314 connects signal mast 310 to connector 208B. In an embodiment, the signal conductors 312 and 314 are conductive chains that flex with the movement of the carriage 102. (See, FIGS. 5B and 5D.) The conductive chains may be weighted to direct the chains away from the path of the carriage 102 when the carriage 102 is in motion.

The signal masts 308 and 310 may be constructed of a ceramic shell enclosing a conductive core 316 that connects to the signal conductors 312 and 314 and provides signals to signal processing equipment 320. If desired, the conductive chains may be connected directly to the probe tips 204A and 204B.

Figure 5A:
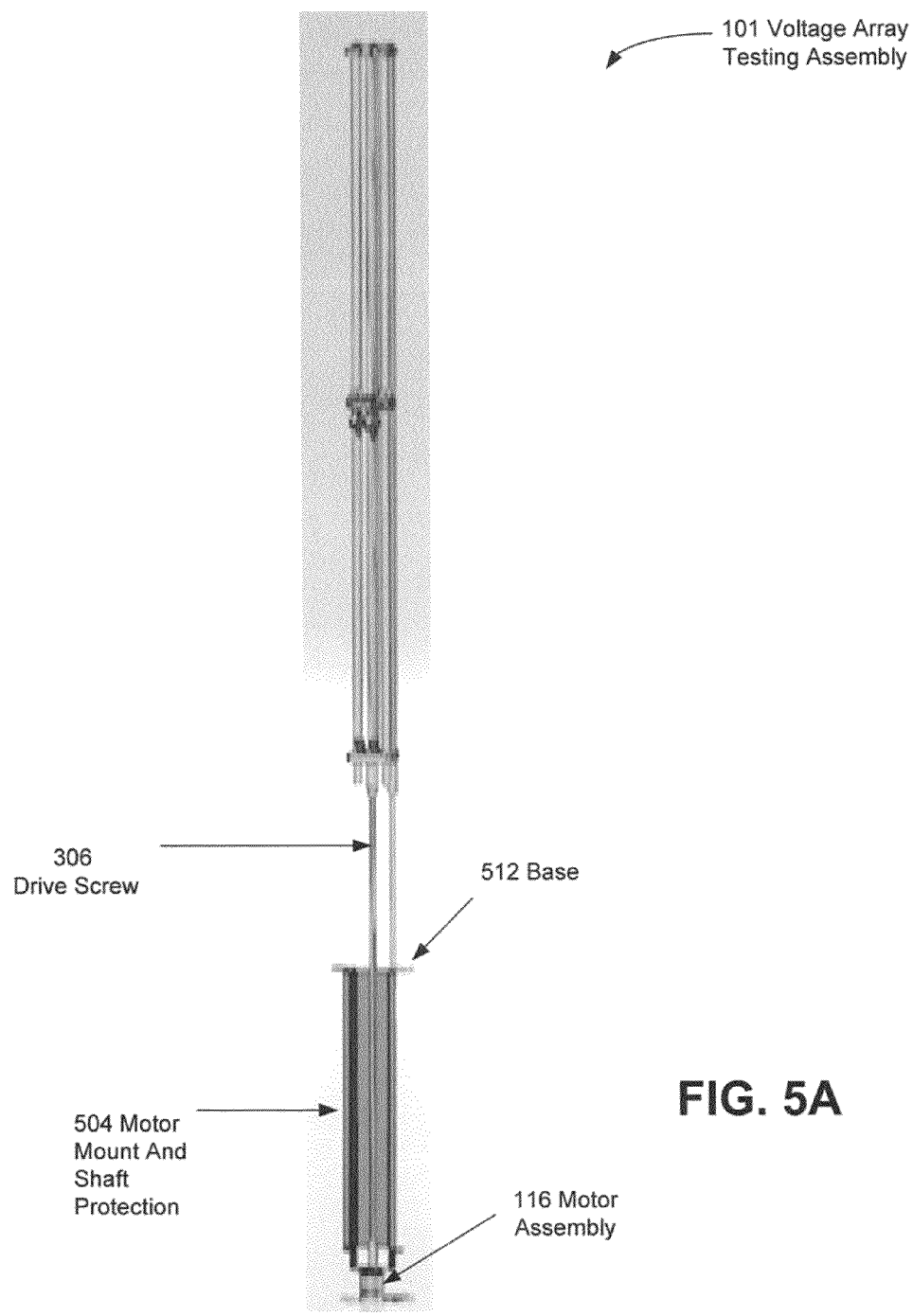
FIG. 5A is an exploded perspective view illustrating components of a voltage array testing assembly of FIG. 1B according to an embodiment.
Figure 5B:
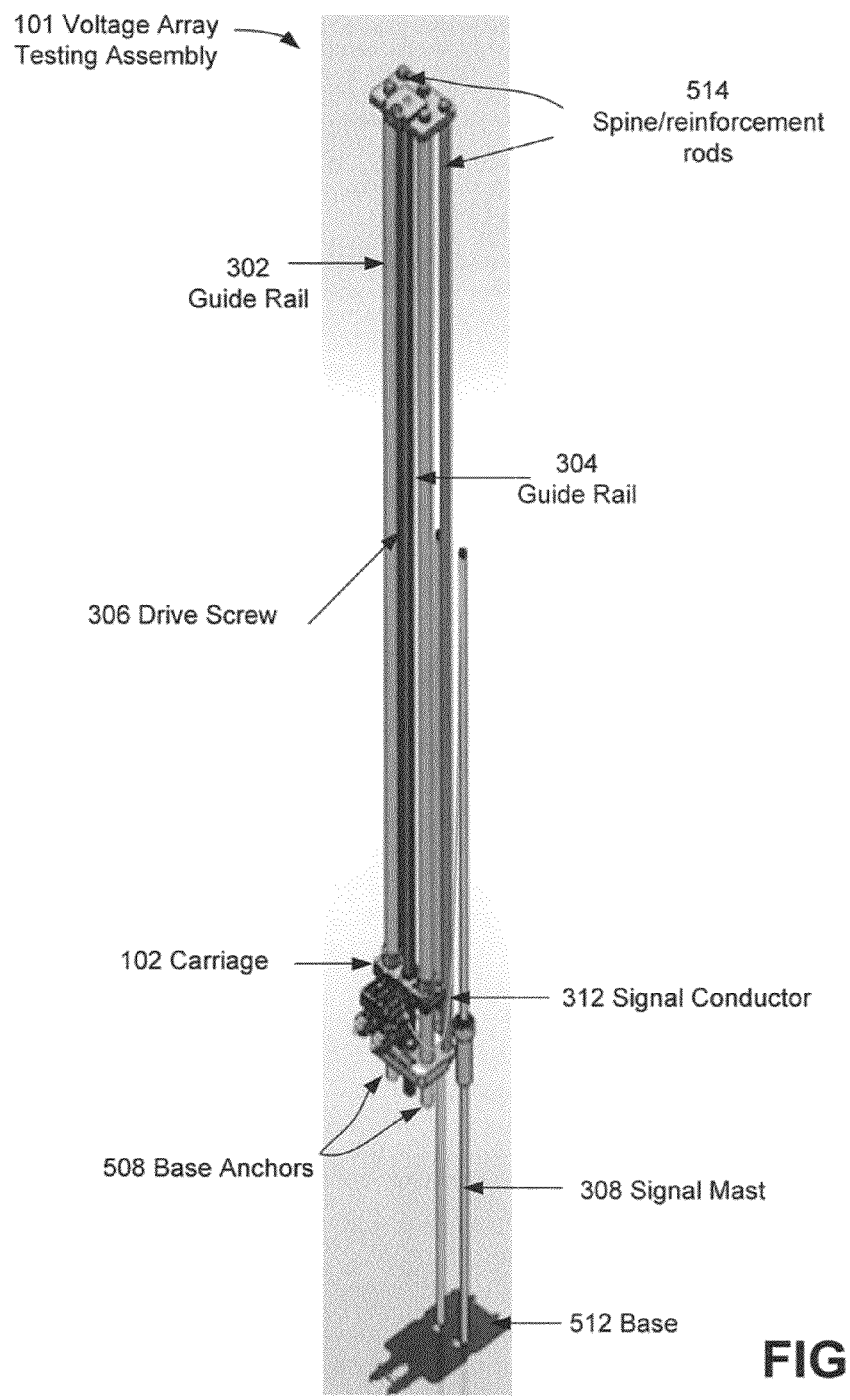
FIG. 5B is an exploded perspective view further illustrating components of a voltage array testing assembly of FIG. 1B according to an embodiment.

FIGS. 5A-5E illustrate components of the voltage source array testing assembly 101. As illustrated in FIG. 5A, the drive screw 306 connects to the motor assembly 116 through a motor mount and shaft protection assembly 504. The motor mount and shaft protection assembly 504 may be located below base 512, for example under table or other structure that supports voltage array 100, or in any other location that permits connection to motion control system 104.

As illustrated in FIG. 5B, the guide rails 302 and 304 are positioned on either side of the drive screw 306. The carriage 102 is propelled by the drive screw 306 and moves along the guide rails 302 and 304. Base anchors 508 are secured to a base 512 during operation of the voltage source array testing assembly 101 (FIG. 5B shows the exploded view for clarity). In addition, the voltage source array testing assembly 101 is stabilized by one or more (for example, two) spine/reinforcement rods 514. The spine reinforcement rods 514 may be constructed of a ceramic. The base 512 also provides support for the fuel cell stack. FIG. 5B also illustrates a signal conductor 312 (signal conductor 314, while present, is not illustrated in FIG. 5B; see also FIG. 3) connected to a signal mast 308. In an embodiment, the signal conductors 312 and 314 are formed from flexible conductive chains.

Figure 5C:
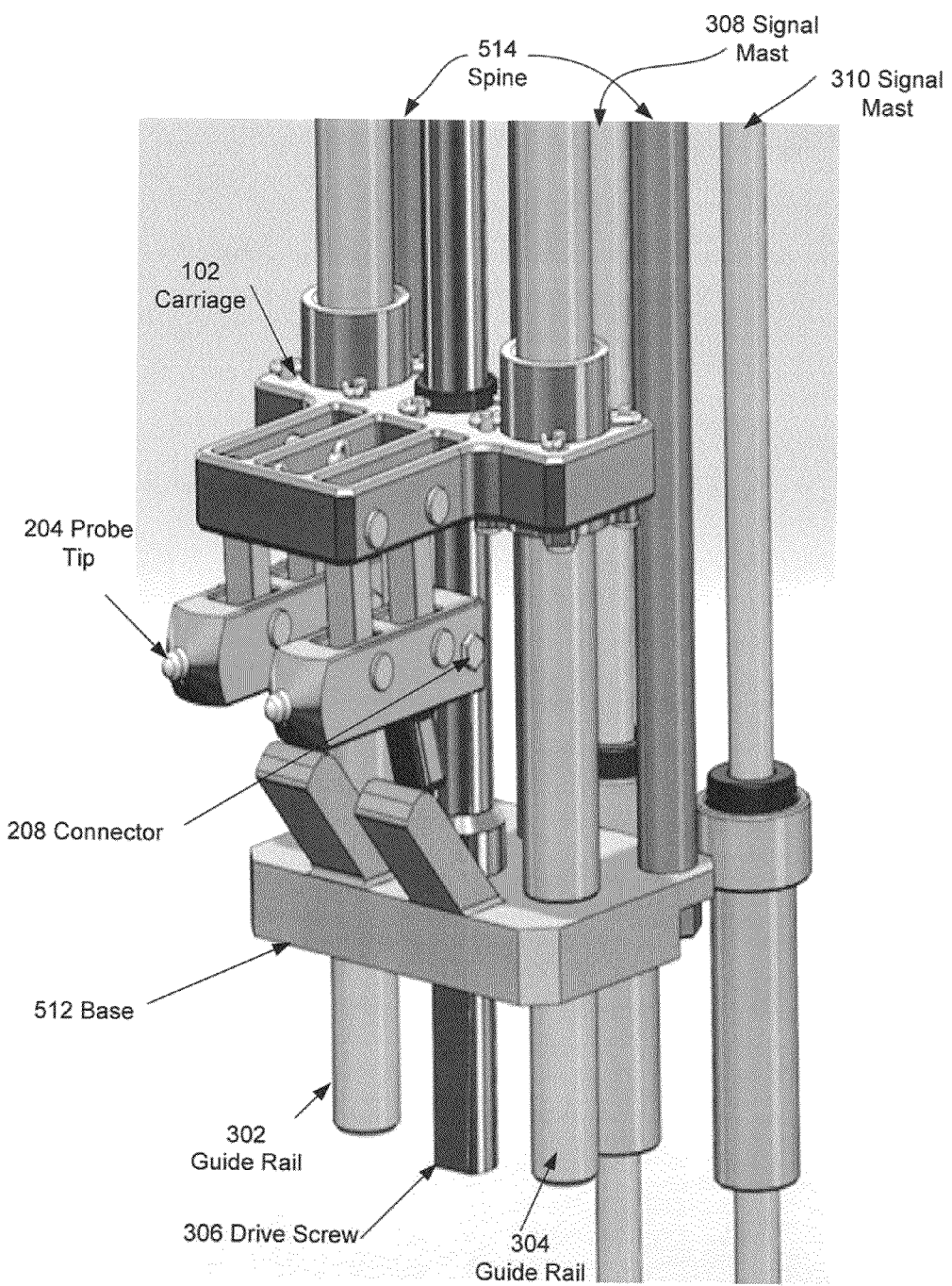
FIG. 5C is a perspective view illustrating a view of selected components of a voltage array testing assembly of FIG. 1B according to an embodiment.

FIG. 5C further illustrates various components of the voltage array testing assembly 101. The guide rails 302 and 304 are positioned on either side of the drive screw 306. The drive screw 306 penetrates the base 512 to connect to the motor assembly 116. The spine/reinforcing rods 514 and the guide rails 302 and 304 may also penetrate the base or be attached to the base 512.

Figure 5D:
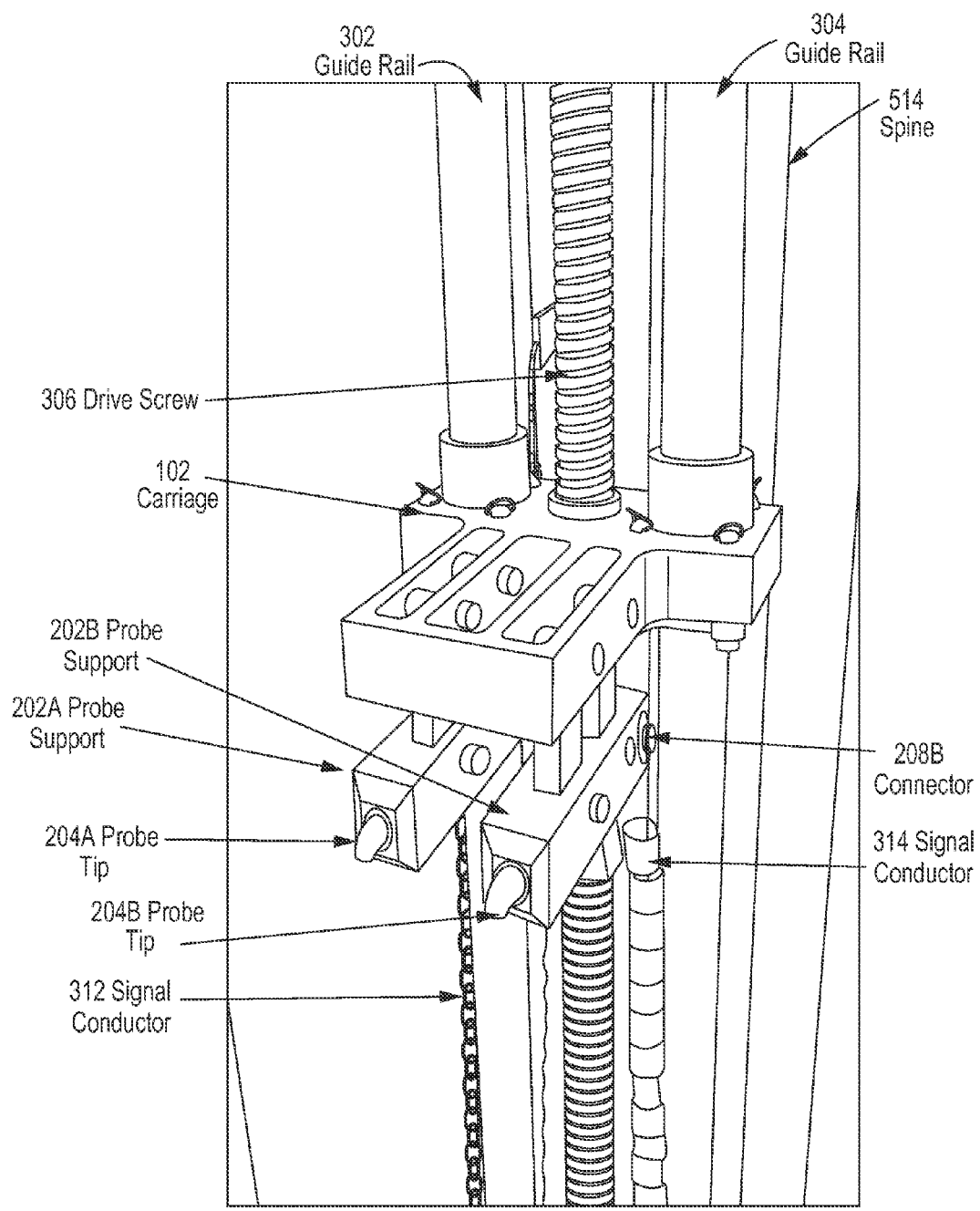
FIG. 5D is a photograph of selected components of an exemplary voltage array testing assembly of FIG. 1B according to an embodiment.

FIG. 5D further illustrates various components of the voltage source array testing assembly 101. The guide rails 302 and 304 are positioned on either side of the drive screw 306 and penetrate the carriage 102. Probe support 202A with probe tip 204A and probe support 202B with probe tip 204B are shown suspended from the carriage 102. Both signal conductors 312 and 314 and one spine 514 are visible. The connection of signal conductor 314 to connector 208B is also visible.

Figure 5E:
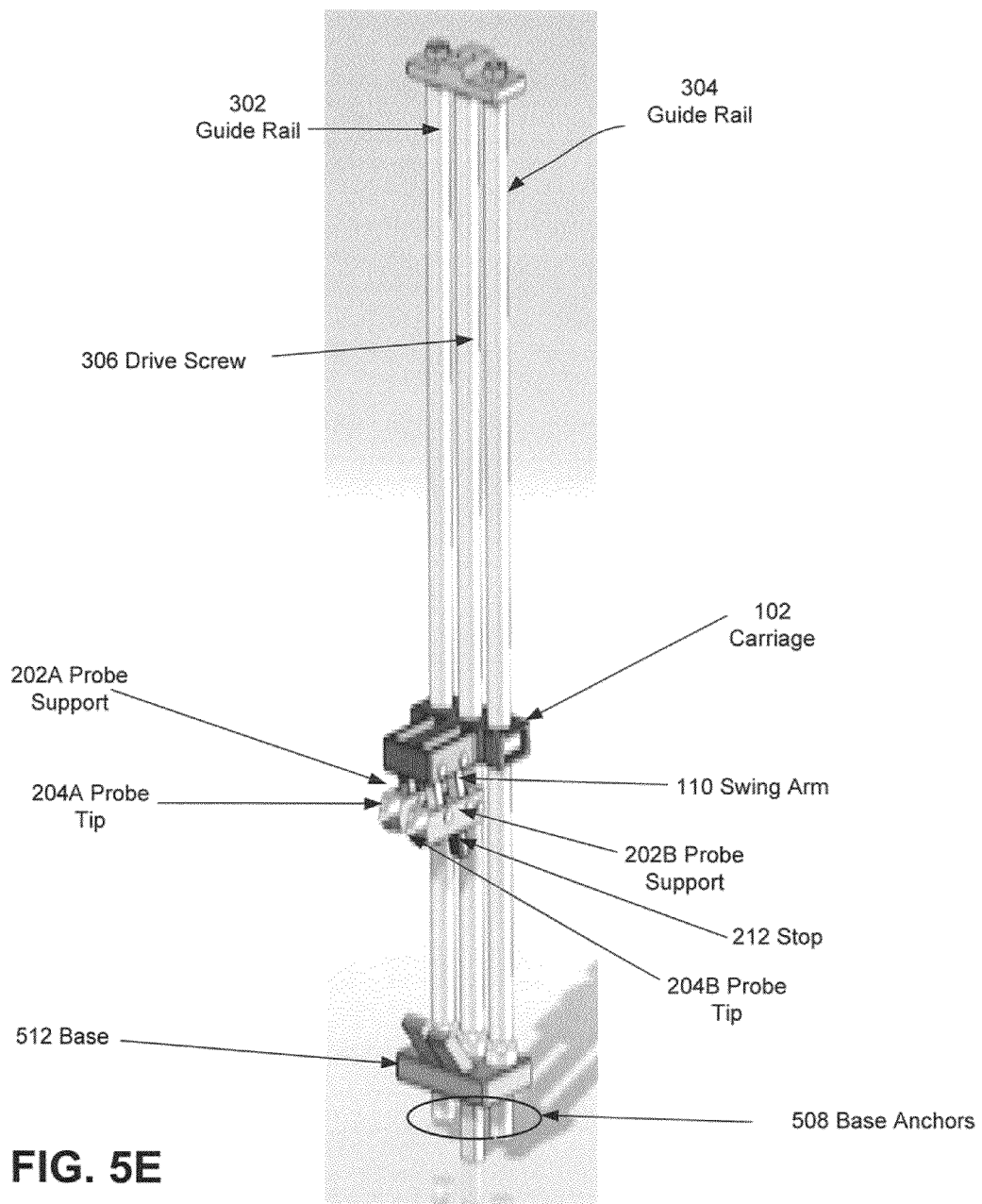
FIG. 5E is a non-exploded perspective view further illustrating components of a voltage array testing assembly of FIG. 1B according to an embodiment.

FIG. 5E is non-exploded a view further illustrating components of a voltage array testing assembly of FIG. 1B according to an embodiment. The guide rails 302 and 304 are positioned on either side of the drive screw 306 and penetrate the carriage 102. Probe support 202A with probe tip 204A and probe support 202B with probe tip 204B are shown suspended from the carriage 102 via swing arms 110. The swing arms 110 move freely on pivot pins, thereby allowing the probe supports 202A and 202B to swing freely below the carriage 102. The probe tips 204A and 204B make contact with the linear voltage array 100 (for example, a fuel cell stack) due to gravitational forces. A base 512 and base anchors 508 are also shown.

Figure 6:
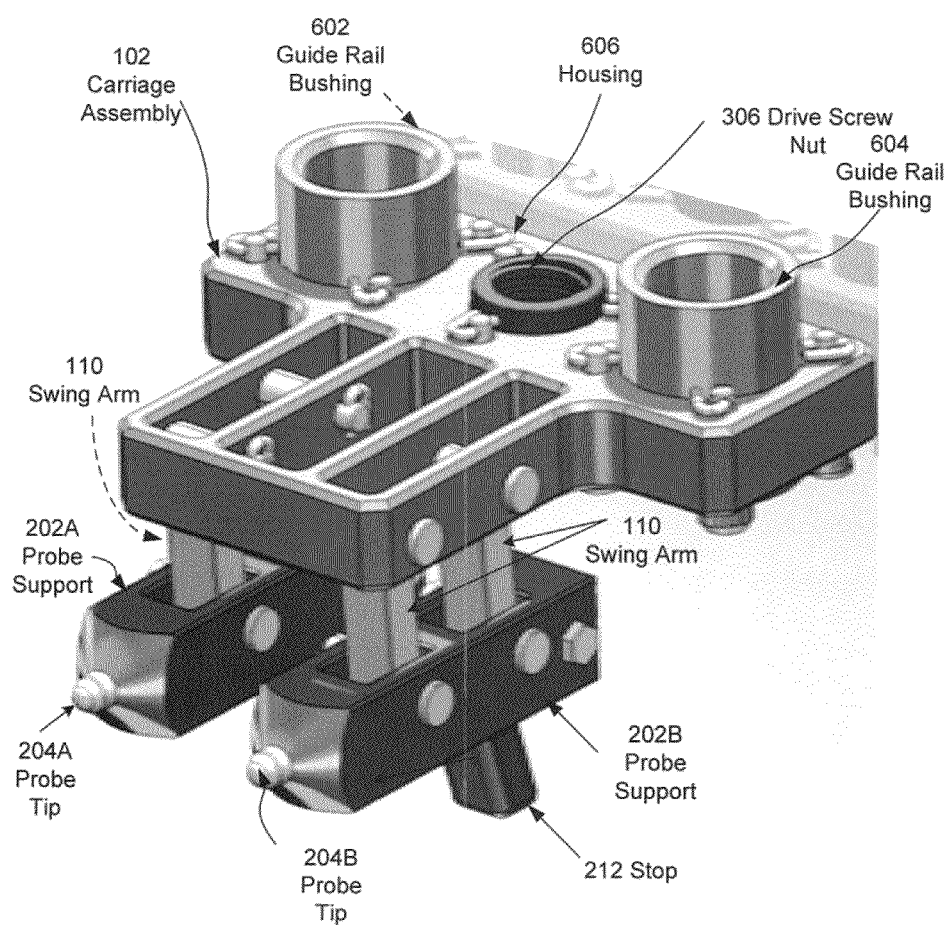
FIG. 6 is a block diagram illustrating a view of a carriage/probe assembly according to an embodiment.

FIG. 6 illustrates a carriage/probe assembly according to an embodiment. The carriage 102 is constructed from discrete components that include a drive screw nut 306 and two guide rail bushings 602 and 604. The drive screw nut 306 and the guide rail bushings 602 and 604 are fastened to the carriage 102 housing 606 by screws or other fasteners. As previously described, the carriage 102 is propelled by a drive screw 305 (see, for example, FIG. 5A) and is guided by guide rails that are passed through the guide rail bushings 602 and 604.

A probe support 202A holds a probe tip 204A. A probe support 202B holds a probe tip 204B. The probe supports 202A and 202B are suspended from the carriage 102 housing 606 by swing arms 110. The swing arms 110 move freely on pivot pins, thereby allowing the probe supports 202A and 202B to swing freely below the carriage 102. The probe tips 204A and 204B make contact with the linear voltage array 100 (for example, a fuel cell stack) due to gravitational forces.

Figure 7:
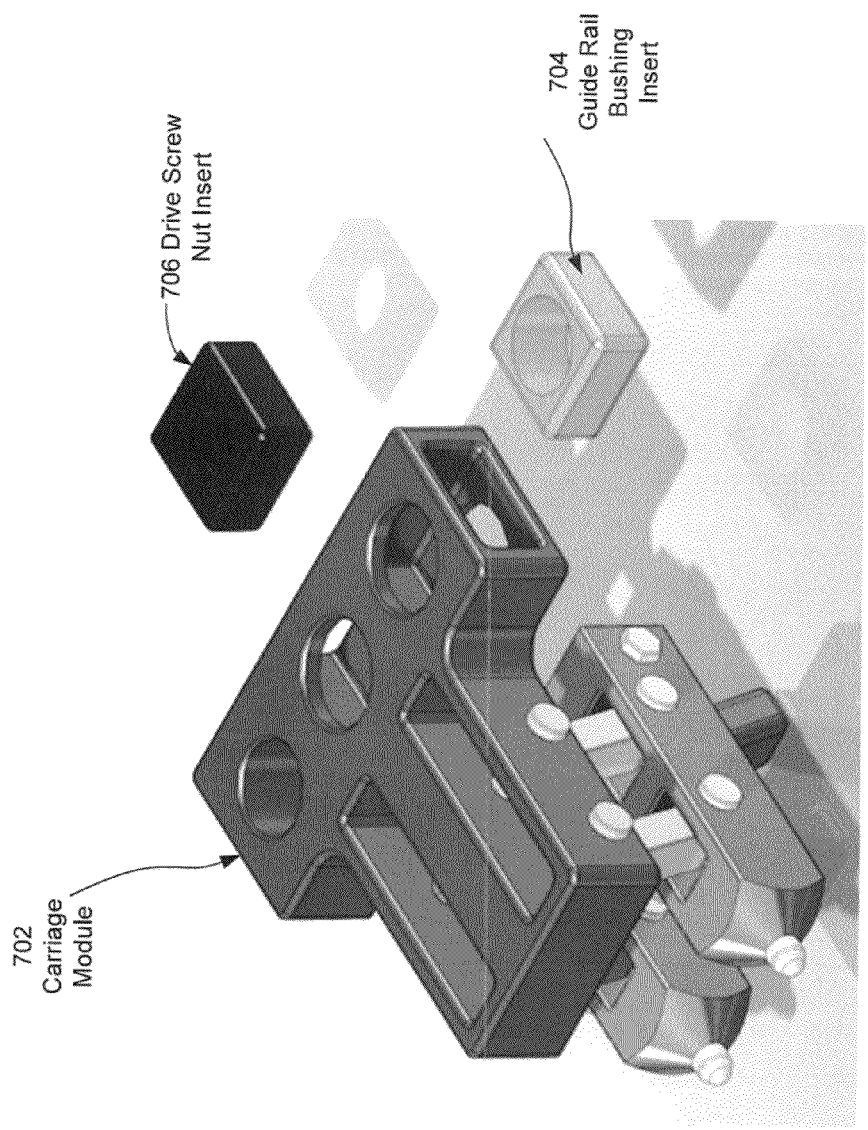
FIG. 7 is a block diagram illustrating a view of a modular carriage/probe assembly according to an embodiment.

FIG. 7 illustrates a modular carriage assembly. In this embodiment, a carriage module 702 (e.g., a housing) is constructed to receive a guide rail bushing inserts 704 and a drive nut insert 706. The inserts do not require fasteners as in the case of the carriage 102 shown in FIG. 6.

In operation of the voltage source array testing assembly 101, a probe position is initially calibrated to the ends of the voltage source array under test. The carriage holding one or more probes moves from one end of the array to the other and then reverses direction. The carriage moves at a sufficient rate of linear speed to meet the competing requirements of quick cycle time and accurate measurement of each discrete element (for example, an interconnect in fuel cell stack) in the voltage source array. The signal masts obtain signal data from the voltage source array. The signal data are received by the signal processing equipment 320 and processed to determine the absolute voltage of each point in the array as well as the differential voltage between points in the same element or in adjacent elements. Discrepant voltage elements are flagged and reported so that downstream processes may correctly respond to any operational issues indicated by the data. In the event of detection of a discrepant voltage element, the entire measurement set could be repeated for confirmation.

In an embodiment, the probe is flexibly supported so as to apply a compression load to the fuel cell stack components, such as interconnects, under test. FIG. 8 is a graph illustrating measurements of fuel cell voltages acquired by a probe of the voltage source array testing assembly constructed according to embodiments hereof in comparison to measurements acquired by direct manual testing of the fuel cell voltages as practiced in the prior art. The manual measurement process entails attaching wires to each interconnect and measuring the absolute and differential voltages using a meter to determine the presence of defects (for example, defective cells or interconnects in the stack).

The scale on the left vertical axis indicates voltage readings taken from a fuel cell stack using a probe and using the prior art methodology. The scale on the right vertical axis indicates the deviation between the measurements acquired using the manual (prior art) methodology and the probe measurements of embodiments of the present invention. As indicated by the legend, data points from the prior art methodology are indicated by a square (□) symbol, measurements acquired from the voltage array testing assembly are indicated by a triangle symbol (Δ), and the probe precision (equal to the difference between the probe measurement and the prior art measurement for a particular fuel cell) is indicated by an "X."

The data indicated that the deviation between the probe measurement and the prior art measurement for a particular fuel cell is less than 3 mV. The data also demonstrate that the voltage array testing assembly identified the low voltage or "bad" cells that were found using the prior art manual process.

Figure 4:
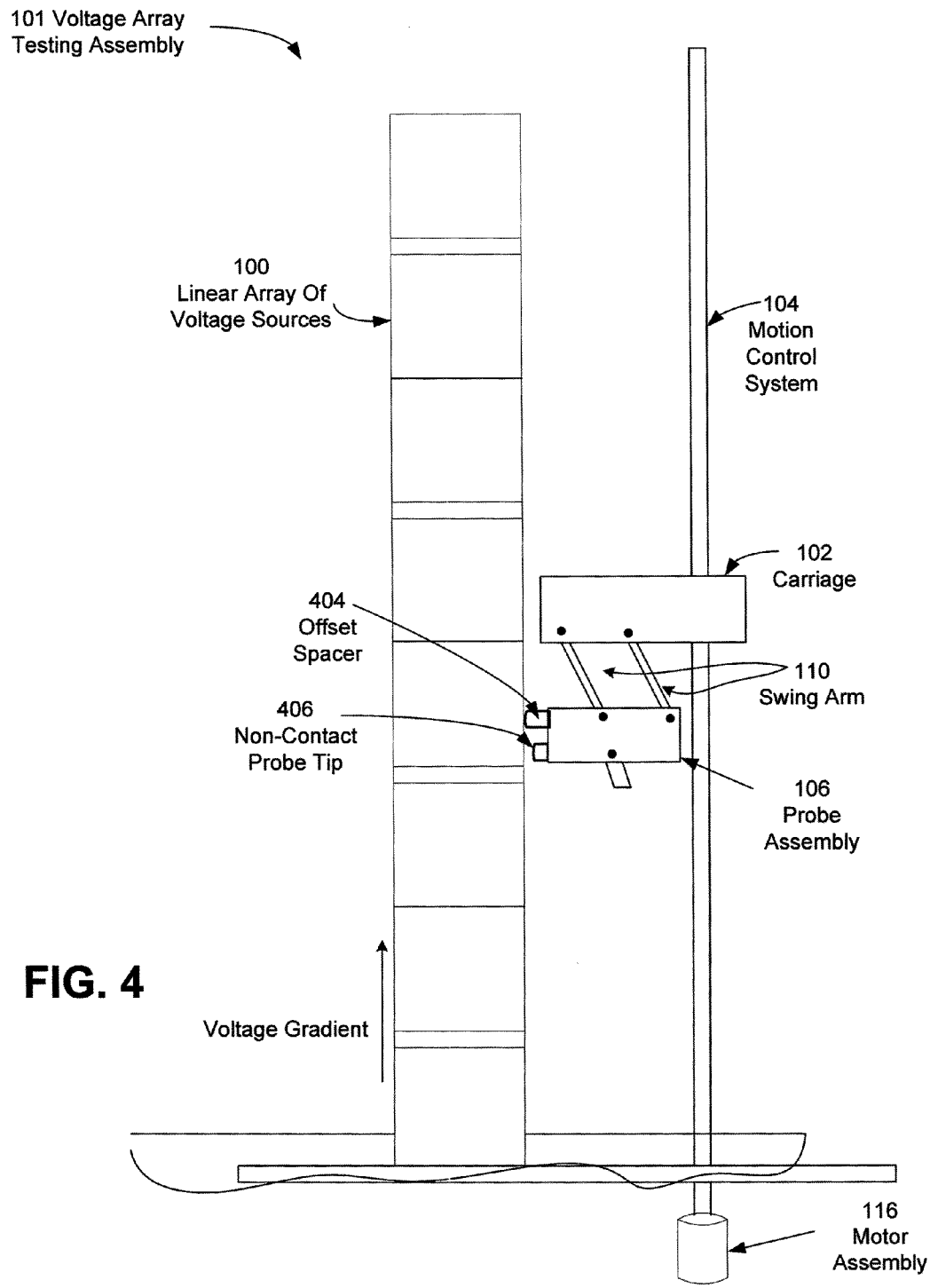
FIG. 4 is a block diagram illustrating a view of a voltage array testing assembly utilizing a non-contact probe according to an embodiment.

FIG. 4 is a block diagram illustrating a view of a voltage array testing assembly utilizing a non-contact probe according to an alternate embodiment. In this embodiment, a sensing probe 406 does not contact the voltage array 100 under test. Rather, the probe is configured to interact with a cyclic electromagnetic field radiated by the voltage array 100. The array 100 and the air gap between the probe 406 and the voltage array 100 form a weak capacitor. The probe may be formed from electrically conductive material, metal or otherwise. In an embodiment, the probe is maintained at a nearly constant displacement from the fuel cell voltage array by a non-conducting offset spacer 404 located on the edge of the probe support 202.

In still another embodiment, the probe 406 may be formed from an electronically sensitive semiconductor junction. In this embodiment, the semiconductor junction forms a sensitive capacitor at the tip of the probe 406. For example, the probe 406 may be made of a high temperature tolerant semiconductor material, such as silicon carbide. Adjacent portions of the silicon carbide rod may be doped with p and n type dopants to form a p-n or p-i-n junction to enhance sensitivity. In this embodiment, a much stronger signal is generated, inherently with higher signal/noise ratio (SNR hereafter) that is resistant to EMI from the environment. Because of the stronger signal, the instrumentation electronics circuitry may be simplified making it less expensive and more reliable.

The normal mode of excitation of the capacitor is for a static negative charge to form on the tip of probe 406. Using a fuel cell stack as an example, the charge accumulates to a static level proportional to the effective capacitance of the capacitor formed by the parallel plate arrangement of the narrow fuel cell interconnect at Voltage 1 (V1) and the probe at Voltage 2 (V2). In steady-state conditions, a conducting path connected from the probe sensing rod, V2, to ground would carry no electrical current. By imposing an additional sinusoidal current on the fuel cell array, the voltage of the fuel cell array oscillates about a mean value sinusoidally. A similar oscillating signal is transmitted through the capacitor formed by the fuel cell interconnect and the probe 406. The oscillating current to ground can be detected by instrumentation. This current will be proportional to the strength of the electric field driving the capacitor and the voltage creating the electric field. The higher the effective capacitance of the capacitor, the stronger this oscillating current signal will be, thereby simplifying the back-end electronics used to detect the signal and interpret the results.

Thus, the device may measure voltage difference across small geometric regions (cells) along a linear array of mechanically coupled voltage sources (e.g., fuel cell stack) without requiring physical contact of the probe 406 and the voltage source array 100.

In another embodiment, a "deck of cards" type or thin sheet type of contact or non-contact probe may be used. The probe may be made of an electrically conductive ceramic or ceramic composite material. Alternatively, the probe may be made of an electrically insulating ceramic sheet or "deck" with plated conductive traces on its surface(s) or conductive wires embedded in its volume and exposed on the tip. The probe may be thinner than the electrolyte of the SOFCs in the stack. This allows the probe to be inserted into a recess near the edge of the electrolyte between the adjacent interconnects in the stack to contact both adjacent interconnects.

In an embodiment, a driving sinusoidal current is superposed on the output of the voltage source array and measurements of phase/magnitude are processed by signal processing equipment (See, FIG. 3, 320) such as a digital signal processor (DSP) or the equivalent. The phase and magnitude measurements may be used to model the voltage source array.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Further, words such as "thereafter," "then," "next," etc. are not intended to limit the order of the steps; these words are simply used to guide the reader through the description of the methods.

One or more block/flow diagrams have been used to describe exemplary embodiments. The use of block/flow diagrams is not meant to be limiting with respect to the order of operations performed. The foregoing description of exemplary embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

Control elements such as SPE 320 may be implemented using computing devices (such as computers) comprising processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

The preceding description of the disclosed embodiments is provided to enable any person skilled in the art to make or use the described embodiment. Various modifications to these embodiments will be readily apparent to those skilled in the art, and the generic principles defined herein may be applied to other embodiments without departing from the scope of the disclosure. Thus, the present invention is not intended to be limited to the embodiments shown herein but is to be accorded the widest scope consistent with the following claims and the principles and novel features disclosed herein.

What is claimed is:

1. A method of testing a fuel cell stack, comprising:
   moving at least one voltage probe along the fuel cell stack; and
   sequentially measuring a voltage of fuel cell stack elements,
   wherein the at least voltage probe includes at least one contact voltage probe, and
   wherein moving at least one voltage probe along the fuel cell stack comprises actuating a screw mechanism to impart a vertical linear motion to a carriage to vertically move the carriage along at least one guide rail parallel to the fuel cell stack, such that the at least one voltage probe supported by at least one probe support from the carriage including at least one swing arm freely swings below the carriage to contact the fuel cell stack elements.

2. The method of claim 1, wherein the at least one contact voltage probe has a resistivity sufficiently high to preclude shorting adjacent fuel cell stack elements.

3. The method of claim 2, wherein the resistivity of the at least one contact voltage probe is in a range of 0.1 Ω-cm to 3 Ω-cm at 850° C.

4. The method of claim 1, further comprising limiting by the at least one contact voltage probe a shorting current to between 1 mA and 100 mA when the at least one contact voltage probe simultaneously contacts two or more fuel cell stack elements.

5. The method of claim 1, wherein the at least one contact probe is constructed from a spinel ceramic material.

6. The method of claim 1, wherein sequentially measuring the voltage of the fuel cell stack elements comprises measuring the voltage relative to a common reference.

7. The method of claim 1,
wherein sequentially measuring the voltage of the fuel cell stack elements comprises measuring the voltage using a measuring device comprising two contact or non-contact voltage probes, and
wherein sequentially measuring the voltage of the fuel cell stack elements comprises:
measuring a first voltage of a first location on the fuel cell stack element with a first probe;
measuring a second voltage of a second location on the fuel cell stack element with a second probe horizontally offset from the first probe, wherein measuring the first voltage and measuring the second voltage occur substantially simultaneously; and
determining a differential voltage between the first and the second locations.

8. The method of claim 1,
wherein sequentially measuring the voltage of the fuel cell stack elements comprises measuring the voltage using a measuring device comprising two contact or non-contact voltage probes, and
wherein sequentially measuring the voltage of the fuel cell stack elements comprises:
measuring a first voltage of a first fuel cell stack element with a first probe;
measuring a second voltage of a second fuel cell stack element with a second probe vertically offset from the first probe, wherein the second fuel cell stack element is offset vertically from, and is located adjacent to, the first fuel cell stack element and wherein measuring the first voltage and measuring the second voltage occur substantially simultaneously; and
determining a differential voltage between the first and the second fuel cell stack elements.

9. The method of claim 1,
wherein the fuel cell stack elements comprise fuel cell interconnects, and
wherein the method further comprises determining an acceptability of a fuel cell located between first and second interconnects in the fuel cell stack based on sequentially measured voltages of the first and the second interconnects.

* * * * *